United States Patent
Hosono et al.

(10) Patent No.: US 11,267,720 B2
(45) Date of Patent: Mar. 8, 2022

(54) METHOD FOR MANUFACTURING ELECTRIDE OF MAYENITE-TYPE COMPOUNDS

(71) Applicants: TOKYO INSTITUTE OF TECHNOLOGY, Tokyo (JP); HIROSAKI UNIVERSITY, Aomori (JP)

(72) Inventors: Hideo Hosono, Tokyo (JP); Toshiharu Yokoyama, Tokyo (JP); Yoshitake Toda, Tokyo (JP); Shintaro Ishiyama, Hirosaki (JP)

(73) Assignee: JAPAN SCIENCE AND TECHNOLOGY AGENCY, Saitama (JP)

(*) Notice: Subject to any disclaimer, the term of this patent is extended or adjusted under 35 U.S.C. 154(b) by 538 days.

(21) Appl. No.: 16/319,776

(22) PCT Filed: Jul. 25, 2017

(86) PCT No.: PCT/JP2017/026817
§ 371 (c)(1),
(2) Date: Jan. 22, 2019

(87) PCT Pub. No.: WO2018/021282
PCT Pub. Date: Feb. 1, 2018

(65) Prior Publication Data
US 2021/0284544 A1    Sep. 16, 2021

(30) Foreign Application Priority Data
Jul. 25, 2016   (JP) .............................. JP2016-145078

(51) Int. Cl.
*C30B 33/04*    (2006.01)
*C01F 7/164*    (2022.01)
(Continued)

(52) U.S. Cl.
CPC .............. *C01F 7/164* (2013.01); *C30B 13/00* (2013.01); *C30B 29/20* (2013.01); *C30B 29/22* (2013.01); *C30B 33/04* (2013.01); *C01P 2006/40* (2013.01)

(58) Field of Classification Search
CPC ......... C30B 13/00; C30B 29/20; C30B 29/22; C30B 33/04; C01F 7/164; C01P 2006/40
See application file for complete search history.

(56) References Cited

U.S. PATENT DOCUMENTS

| 2005/0053546 A1 | 3/2005 | Hosono |
| 2006/0151311 A1 | 7/2006 | Hosono |

(Continued)

FOREIGN PATENT DOCUMENTS

| CN | 101160638 A | 4/2008 |
| CN | 102549707 A | 7/2012 |

(Continued)

OTHER PUBLICATIONS

Lee et al "Defect chemistry of the cage compound, Ca12Al14O33d—understanding the route from a solid electrolyte to a semiconductor and electride" Phyiscal Chemistry Chemical Physics 2009 vol. 11 3105-3114.*

(Continued)

*Primary Examiner* — Robert M Kunemund
(74) *Attorney, Agent, or Firm* — Steven M. Koehler; Westman, Champlin & Koehler, P.A.

(57) ABSTRACT

Provided is a manufacturing method with which it is possible to convert a mayenite-type compound to an electride, wherein a reducing agent is not required, reaction conditions include a temperature that is lower than that in the related art, and the reaction is performed more quickly in a simple manner, and, additionally, by requiring a lower amount of energy. Provided is a method for manufacturing an electride (Continued)

of mayenite-type compounds, the method being characterized in that a mayenite-type compound is converted to an electride by making a current directly flow through the mayenite-type compound by applying a voltage to the mayenite-type compound in a heating state.

5 Claims, 11 Drawing Sheets

(51) Int. Cl.
  *C30B 13/00* (2006.01)
  *C30B 29/20* (2006.01)
  *C30B 29/22* (2006.01)

(56) References Cited

U.S. PATENT DOCUMENTS

| | | | |
|---|---|---|---|
| 2008/0252194 A1 | 10/2008 | Kuroiwa et al. | |
| 2009/0224214 A1 | 9/2009 | Hosono | |

FOREIGN PATENT DOCUMENTS

| | | | |
|---|---|---|---|
| EP | 1717217 | A1 | 11/2006 |
| EP | 1900689 | A1 | 3/2008 |
| EP | 2865648 | A1 | 4/2015 |
| EP | 2865782 | A1 | 4/2015 |
| JP | 2002-316867 | A | 10/2002 |
| JP | 2003-128415 | A | 5/2003 |
| JP | 2009203126 | A | 9/2009 |
| JP | 2013040081 | A | 2/2013 |
| JP | 2014-055313 | A | 3/2014 |
| JP | 2014-141353 | A | 8/2014 |
| JP | 2015124401 | A | 7/2015 |
| KR | 20150021519 | A | 3/2015 |
| KR | 20150051215 | A | 5/2015 |
| KR | 20150061633 | A | 6/2015 |
| WO | 2005000741 | A1 | 1/2005 |
| WO | 2005077859 | A1 | 8/2005 |
| WO | 2006129675 | A1 | 12/2006 |
| WO | 2007060890 | A1 | 5/2007 |
| WO | 2013191210 | A1 | 12/2013 |
| WO | 2013191211 | A1 | 12/2013 |
| WO | 2014034473 | A1 | 3/2014 |
| WO | 2014077215 | A1 | 5/2014 |

OTHER PUBLICATIONS

Lee et al., "Defect chemistry of the cage compound, Ca12Al14O33 understanding the route from a solid electroyte to a semiconductor and electride" Physical Chemistry Chemical Physics 2009 11 3105-3114. as supplied by applicants on 10/21.*
H. V. Bartl and T. Scheller, Neuses Jahrb. Mineral. Monatsh. 12, 547-552(1970).
S. Matsuishi, Y. Toda, M. Miyakawa, K. Hayashi, T. Kamiya, M. Hirano, I. Tanaka, and H. Hosono, Science, 301, 626-629 (2003).
S. W. Kim, S. Matsuishi, M. Miyakawa, K. Hayashi, M. Hirano, and H. Hosono, Journal of Materials Science: Materials in Electronics, Oct. 2007, vol. 18, pp. 5-14.
S. Matsuishi, T. Nomura, M. Hirano, K. Kodama, S. Shamoto, and H. Hosono, Chem. Mater. 2009, 21, 2589-2591.
J. H. Chung, J. H. Ryu. J. W. Eun, B. G. Choi, and K. B. Shim, Electrochem. Solid-State Lett. 2011, vol. 14, issue 12, E41-E43.
Masaaki Kitano et al., "12CaO•7Al2O3 Electride Tanji Ru Shokubai ni yoru Ammonia Gosei", CSJ : The Chemical Society of Japan Koen Yokoshu, Mar. 8, 2013 (Mar. 8, 2013), vol. 93rd, No. 2, p. 465, 2 G4-35.
Yasunori Inoue et al., "12CaO•7Al2O3 Electride no Ko Hyomensekika no Kento to Ammonia Gosei Hanno no Oyo", CSJ : The Chemical Society of Japan Koen Yokoshu, Mar. 8, 2013 (Mar. 8, 2013),vol. 93rd, No. 2, p. 465, 2 G4-37.
Satoru Matuishi et al., Stable Inorganic Electride C12A7:e-:Electronic Properties and Structure, Journal of the Crystallographic Society of Japan, 49, 171-178, 2007.
Masashi Miyakawa et al., J. of the Ceramic Soc. of Japan, 2007, 115 [9] 567-570.
International Search Report for International patent application No. PCT/JP2017/026817, dated Aug. 29, 2017.
Office Action in corresponding Chinese Patent Application No. 2017800445045, dated Oct. 10, 2020.
Office Action in corresponding Japanese Patent Application No. 2018-529899 dated Jun. 1, 2021, 4 pages.
Notice of Allowance in corresponding Korean Patent Application No. 10-2019-7003914 dated Aug. 30, 2021.

* cited by examiner

METHOD FOR MANUFACTURING ELECTRIDE OF MAYENITE-TYPE COMPOUNDS

TECHNICAL FIELD

The present invention relates to a method for manufacturing an electride of mayenite-type compounds.

This application claims priority right based on Japanese Patent Application No. 2016-145078 filed in Japan on Jul. 25, 2016, the content of which is hereby incorporated by reference.

BACKGROUND ART

Among calcium aluminosilicates containing CaO, $Al_2O_3$, and $SiO_2$, there is a material which has a mineral name "mayenite". A compound which has the same crystal structure as a crystal of the mayenite is referred to as "mayenite-type compound".

The mayenite-type compound has a representative composition of $12CaO \cdot 7Al_2O_3$ (hereinafter sometimes abbreviated as "C12A7"). It has been reported that the crystal of C12A7 has a unique crystal structure (Patent Document 1). Among 66 oxide ions in a unit cell containing two molecular formulae, two oxide ions, which are "free oxide ion" ($O^{2-}$) as counter anions, are included within sub-nanometer space in a positively charged cage formed by the crystal framework.

The present inventors have studied on C12A7 since 1980's. A mayenite-type compound having electrical conductivity (hereinafter referred to as "conductive mayenite-type compound") was found with respect to a mayenite-type compound which is usually an insulator (Patent Document 1).

The conductive mayenite-type compound (hereinafter, sometimes abbreviated to C12A7:$e^-$) is a compound in which the free oxide ions in the aforementioned cage of mayenite-type compound were substituted with electrons. The theoretical maximum concentration of the electrons is $2.3 \times 10^{21}$ cm$^{-3}$. The conductive mayenite-type compound can be referred to as an inorganic electride (Non-Patent Document 2). C12A7:$e^-$ reported by the present inventors is the first electride stable at normal temperature in the atmosphere (Non-Patent Document 3).

Various studies have also been made on methods for manufacturing the conductive mayenite-type compounds. For example, a method for manufacturing the conductive mayenite-type compound by melting a mayenite-type compound, holding the same in an atmosphere of low oxygen partial pressure, and then cooling and solidifying it has been proposed (Patent document 2). Also, a method for manufacturing the conductive mayenite-type compound by mixing a precursor of a mayenite-type compound with a reducing agent and heat-treating the mixture has been proposed (Patent Document 3).

In the year 2007, it becomes possible to further include a larger amount of electrons in the crystal by subjecting a single crystal of C12A7, a powder of C12A7, or a thin film of C12A7 to a high temperature heat treatment in a titanium metal vapor. It is succeeded in production of C12A7 having metallic electrical conductivity. In addition, an electron-emitting device using C12A7: e– was prepared (Patent Document 4).

In addition to the above-mentioned manufacturing methods, other examples of the manufacturing methods include a method for direct synthesis by metal Ca reduction method (Non-Patent Document 4); a method of one-step synthesis by using a spark plasma sintering method C12A7: $e^-$ without a reducing agent such as Ti (Non Patent Document 5); a method of forming a thin film of C12A7 electride on a substrate by a vapor deposition method (Patent Document 5); and a method of manufacturing a conductive mayenite-type compound by placing an aluminum foil on a mayenite-type compound, and maintaining it at a high temperature under an atmosphere of low oxygen partial pressure (Patent Document 6).

[Patent Document 1] WO 2005/000741
[Patent Document 2] WO 2005/077859
[Patent Document 3] WO 2006/129675
[Patent Document 4] WO2007/060890
[Patent Document 5] WO2013/191210
[Patent Document 6] WO2013/191211
[Non-Patent Document 1] HB Bartl and T. Scheller, Neuses Jarhrb. Mineral. Monatsh. 12, 547-552 (1970).
[Non-Patent Document 2] S. Matsuishi, Y. Toda, M. Miyakawa, K. Hayashi, T. Kamiya, M. Hirano, I. Tanaka, and H. Hosono, Science, 301, 626-629 (2003).
[Non-Patent Document 3] SW Kim, S. Matsuishi, M. Miyakawa, K. Hayashi, M. Hirano, and H. Hosono, Journala of Materials Science: Materials in Electronics, October 2007, Vol. 18, pp 5-14.
[Non-Patent Document 4] S. Matsuishi, T. Nomura, M. Hirano, K. Kodama, S. Shamoto, and H. Hosono, Chem. Master 2009, 21, 2589-2591.
[Non-Patent Document 5] J H Chung, J H Ryu. J W Eun, B G Choy, and KBShim, Electrochem. Solid-State Lett. 2011, vol. 14, issue 12, E41-E43.

SUMMARY OF THE INVENTION

A mayenite-type compound, as described above, by various methods using a reducing agent, can be converted to a conductive mayenite-type compound. That is, it can be converted to an electride of mayenite-type compounds.

In this method, as shown in FIG. 2, for example, when a metal Ti was used as a reducing agent, free oxide ions ($O^{2-}$) react with the metal Ti by the reaction shown in the following reaction formula. Thereby, $TiO_2$ which is an oxide of the reducing agent is formed. Next, free oxide ions are extracted from the cage and substituted with electrons ($e^-$).

$$Ti + 2O^{2-} \rightarrow TiO_2 + 4e^- \qquad (1)$$

However, for example, the manufacturing methods disclosed in Patent Documents 1 to 4 and Non-Patent Document 3 need complicated works such as mixing a reducing agent such as metal Ti or metal Ca with the mayenite-type compound, or coating on the surface thereof. In addition, these manufacturing methods usually require a high temperature reaction at 1000° C. or more, and need heating for a long time.

In order to finally obtain the electride, it is necessary to remove an oxide such as $TiO_2$ or CaO which is produced as a by-product after the reduction reaction from the surface of the electride. As a result, a lot of time, energy and complication work are required. Therefore, the methods are not likely to be a practical technique.

In order to put an electride into practical use, there was a demand for a manufacturing technique that makes it possible to convert a mayenite-type compound to an electride with less energy at a lower temperature and in a shorter time without using a reducing agent.

A manufacturing method without using a reducing agent is described in Non-Patent Document 5. However, this manufacturing method requires a plasma discharge device because it uses discharge plasma sintering method. In addition, the manufacturing method requires heating at 1000° C. or more and vacuum equipment as the same as the method using a reducing agent. Therefore, it is still not likely to be a practical technique.

The present invention has been made for a purpose of solving the above-described problems, and it is an object of the present invention to provide a method for manufacturing an electride of mayenite-type compounds which does not require a reducing agent and which can be easily carried out at low temperature, more quickly in a simple manner.

As a result of intensive studies, the present inventors have found a method of converting a mayenite-type compound into an electride by making a current directly flow through the mayenite-type compound by applying a voltage to the mayenite-type compound in a heating state.

That is, the gist of the present invention are as follows:

[1] A method for manufacturing an electride of mayenite-type compounds, the method comprising: converting a mayenite-type compound to an electride by making a current directly flow through the mayenite-type compound by applying a voltage to the mayenite-type compound in a heating state.

[2] The method for manufacturing an electride of mayenite-type compounds according to [1], wherein the voltage is applied until an electrical resistivity of the mayenite-type compound becomes $1.0 \times 10^5 \Omega \cdot cm$ or less.

[3] The method for manufacturing an electride of mayenite-type compounds according to [1] or [2], wherein a positive electrode and a negative electrode are provided to the mayenite-type compound to making a current directly flow.

[4] The method for manufacturing an electride of mayenite-type compounds according to any one of [1] to [3], wherein the mayenite-type compound is converted to an electride under an inert gas atmosphere.

[5] The method for manufacturing an electride of mayenite-type compounds according to any one of [1] to [4], wherein an electron concentration in the electride of mayenite-type compounds is $1.0 \times 10^{20}/cm^3$ or more.

According to the present invention, it is possible to provide a manufacturing method which does not require a reducing agent and can convert the mayenite-type compound into an electride at a lower temperature, more quickly, and even less energy than the conventional method.

In addition, since a mayenite-type compound can be converted into an electride by making an electric current flow directly to the mayenite-type compound, a microfabricated conductive mayenite-type compound can be easily manufactured.

DETAILED DESCRIPTION OF THE INVENTION

Figure 1:
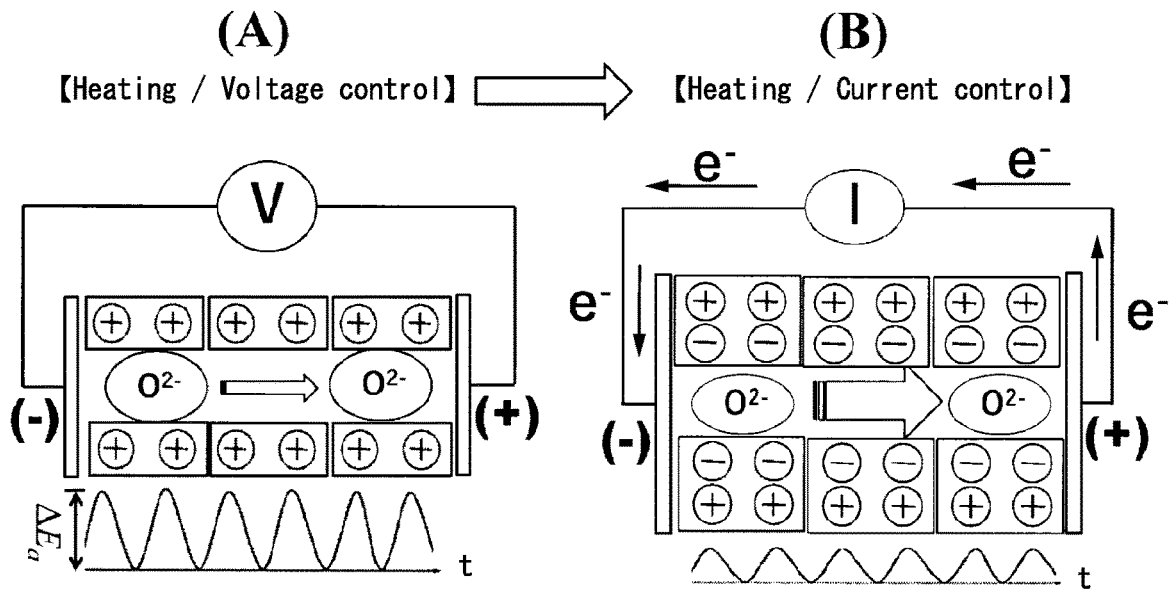
FIG. 1 is a schematic view showing the concept of a heating/voltage control step (A) and a heating/current control step (B) in the manufacturing method of the present invention.
Figure 2:
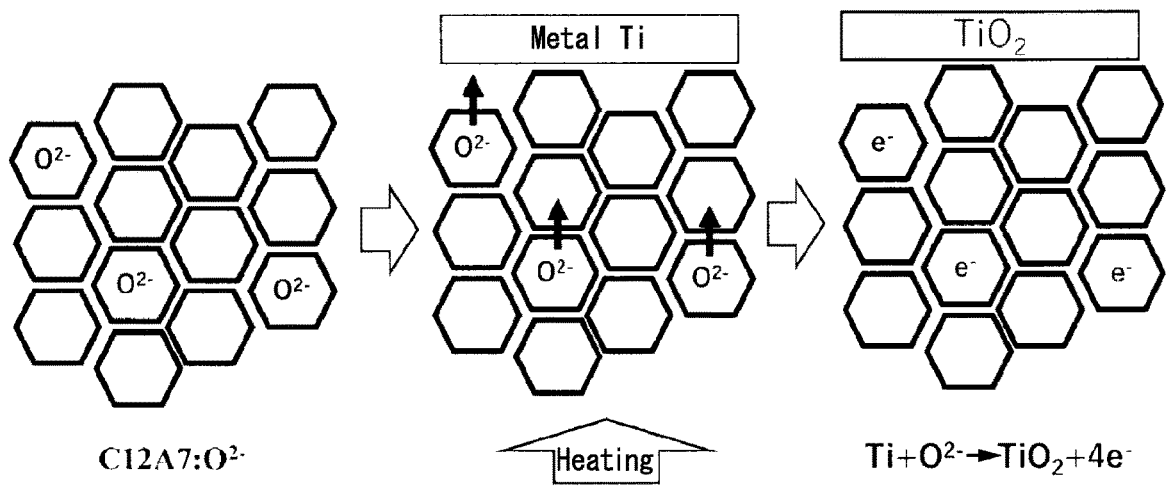
FIG. 2 is a view showing a concept of a conventional method of extracting free oxide ions by a reduction method.

Embodiments of the present invention will be described in detail below.

The mayenite-type compound used in the present invention has a representative composition represented by $12CaO \cdot 7Al_2O_3$.

A crystal of the mayenite-type compound has a cage-structure in which cages share wall surfaces with each other and are connected with each other three-dimensionally. An anion such as $O^{2-}$ is included within the cage of the mayenite-type compound. The $O^{2-}$ can be substituted with other anions or conduction electrons by chemical treatment. The anion is not particularly limited, examples of the anions include an $O^{2-}$ ion, an $F^-$ ion, a $Cl^-$ ion and the like.

The cage forming a skeleton of the mayenite-type compound contains cations such as Ca, Al and the like. Some or all of these cations may be substituted with another cation.

The mayenite-type compound is not particularly limited. Specific examples thereof include the following examples.

Compounds formed only with Ca, Al and O atoms;

Compounds in which all of Ca are substituted with cations such as other alkaline earth metal ions, for example, strontium aluminate ($Sr_{12}Al_{14}O_{33}$);

Calcium strontium aluminate ($Ca_{12-x}Sr_xAl_{14}O_{33}$) in which a part of Ca is substituted with another cation, for example, a mixed crystal in which the mixing ratio of Ca and Sr is arbitrarily changed;

Compounds in which Al is substituted with other cations, for example, $Ca_{12}Al_{10}Si_4O_{35}$ which is a silicon substituted mayenite-type compound; or Compounds in which both cations and anions are substituted, for example, Wadalite $Ca_{12}Al_{10}Si_4O_{32}:6Cl^-$.

The shape of the mayenite-type compound used in the present invention is not particularly limited, and it is may be a powder form, a fine grain form, a granular form, a bulk form, a thin film form obtained by a vapor phase method, or the like. In addition, a sintered body obtained by sintering a powdered mayenite-type compound or a single crystal obtained by a floating zone (FZ) method or the like, as an example of a bulk type, may be used.

In addition, it is also possible to produce a conductive mayenite-type compound directly from a starting material by using the starting material for manufacturing the mayenite-type compound. Specifically, in the case of C12A7, a calcium component and an aluminum component may be used. Examples of the calcium component include calcium carbonate, calcium hydroxide, calcium oxide, metallic calcium and the like. Examples of the aluminum component include aluminum oxide, aluminum hydroxide, metal aluminum and the like. The starting materials can be mixed with cationic ratios according to stoichiometry of the objectives. Mixed oxides of calcium and aluminum such as $CaAl_2O_4$ and $Ca_3Al_2O_6$ may also be used.

Among them, in the present invention, the shape of the mayenite-type compound is preferably a single crystal because the movement of the anions in the cage such as the oxide ions is smooth.

The manufacturing method of the present invention is characterized in that the mayenite-type compound is converted into an electride by making a current directly flow through the mayenite-type compound by applying a voltage to the mayenite-type compound in a heating state. This will be described in detail below.

In the manufacturing method of the present invention, a voltage is applied to the mayenite-type compound, and a current flows directly. It is not particularly limited as long as current flows directly through a mayenite-type compound as a starting material. Specifically, a positive electrode and a negative electrode are provided to the mayenite-type compound and a voltage is applied from these electrodes so that a current can flow directly through the mayenite-type compound.

The material of the electrode is not particularly limited. Materials that are durable to high temperature conditions due to heating or materials resistant to oxidation may be used. Examples of the materials include C (carbon), Ti, Ni, Mo, W, Ta, Pt, Ni—Cr alloys and the like. A metal such as Pt, Ti, or Ni which can be provided by a vapor deposition method such as sputtering is preferable.

The method of providing the electrode is not particularly limited. Specifically, a method of providing the electrode by mechanical contact or a method of providing the electrode by vapor deposition such as sputtering may be used. Among these, since it is possible to provide the electrodes having any size (for example, a tiny area) at any place of a sample of the mayenite-type compound having any size, a vapor deposition method is preferable.

As a method of making a current directly flow through the mayenite-type compound, a current may be directly flow through the mayenite-type compound by filling the mayenite-type compound in a conductive container and applying a voltage to the container. Examples of the materials of the conductive container include, but are not limited to, metal, graphite and the like. The shape of the container is not particularly limited as long as the current can flow directly into the mayenite-type compound filled in it.

As a specific method, for example, there is a method in which a conductive material is used as a lid at both ends in a cylindrical insulator container, a mayenite-type compound is filled between the lids, and a current is made flow through the lid.

Among them, a method of providing an electrode on the mayenite-type compound and making a current flow is preferable from the viewpoint that the operation is easy and the required energy amount can be reduced.

In the manufacturing method of the present invention, when a voltage is applied to the mayenite-type compound, the mayenite-type compound is placed under a heating condition. Here, a phenomenon that free oxide ions in the cage of the mayenite-type compound are diverged outside the cage and electrons are included in the cage instead of the oxide ions is referred to as converting the mayenite-type compound into an electride. Here, the mayenite-type compound to which a voltage is applied under heating condition for converting it into an electride is referred to as a heated object (object to be heated). The heated object may be the above-mentioned mayenite-type compound to which electrodes are provided.

The heating method is not particularly limited, but it is possible to heat the heated object externally by a heater or the like, or by heat generated by making an electric current flow through the heated object (hereinafter may be referred to as self-heating).

The heating temperature of the heated object is not particularly limited and can be appropriately selected according to the progress degree of converting the mayenite-type compound into an electride. It may be a temperature lower than a melting point of the mayenite-type compound used. For example, when the heated object is made from C12A7, the heating temperature is lower than 1450° C. A higher heating temperature is advantageous from the viewpoint that mobility of free oxide ions in the mayenite-type compound increases as the temperature rises. However, a lower heating temperature is preferable from the viewpoint that energy efficiency is advantageous and a high temperature heat source is unnecessary. Further, the heating temperature is preferably 40° C. or less from the viewpoint of being able to prevent the oxidation of the mayenite-type electrode. Further, a temperature history of heating is not particularly limited as long as the effect of the present invention can be obtained and the heating may be performed continuously or intermittently. Also, it is possible to performing heating at a constant temperature, or increase or decrease temperature stepwise.

The voltage to be applied to the heated object is not particularly limited and can be appropriately set as long as the effect of the present invention can be obtained. It may be higher than 0 V and the voltage is not specified as long as a current flow through the mayenite-type compound as described later. A magnitude of a preferable voltage depends on an ionic conductivity of the mayenite-type compound at the heating temperature. An upper limit is lower than a voltage causing dielectric breakdown. The voltage is preferably 200 V or less from the viewpoint of convenience of a power supply device or the like.

The history of applying a voltage is not particularly limited as long as the effect of the present invention can be obtained, and it may be performed continuously or intermittently. The voltage may be applied at a constant or may be applied at an increasing or decreasing rate.

A value of the current directly flowing through the heated object is not particularly limited as long as the effect of the present invention can be obtained. Specifically, a value may be used if it is possible to confirm that a current directly flows through heated object. A current density may be 0.001 $A\ cm^{-2}$ or more and 10 $A\ cm^{-2}$ or less.

Since the mayenite-type compound is an electric insulator, the current hardly flows through it. A current may flow through the mayenite-type compound during heating and applying voltage by a method specifically described later or the like. A specific method of making a current flow through the mayenite-type compound will be described later.

The manufacturing method of the present invention can be carried out by appropriately combining the above-mentioned heating method, the above-mentioned method of applying voltage and the above-mentioned method of making a current flow through the mayenite-type compound. Specific combination of each method is not particularly limited. Preferably, examples of the methods include methods under the following conditions 1 to 3.

Condition 1: A Method in which a Voltage is Stepwise Increased at a Heating Temperature Having a Predetermined Value Specifically, in a state where no voltage is applied to the heated object, heating treatment is first performed at a predetermined temperature, and then a voltage to be applied to the heated object is gradually applied from 0 V.

Condition 2: A Method of Gradually Increasing the Heating Temperature while the Voltage Having a Predetermined Value is Applied Specifically, a voltage to be applied to the heated object at an ordinary temperature is set, and the temperature is gradually increased from room temperature.

Condition 3: A Method of Increasing Both Heating Temperature and Voltage

Specifically, heating and applying voltage are gradually carried out to the heated object while adjusting the heating temperature and the applied voltage at the same time from the state where the voltage are not applied and at the room temperature.

The mayenite-type compound may be converted into an electrode by heating and applying a voltage to the heated object. It is preferable that steps of converting the mayenite-type compound to an electrode are carried out as follows.

First, since the mayenite-type compound is an electric insulator at room temperature, in the heated object, almost no current flows at the beginning of applying voltage, and only a very small amount of current flows even if a current flows. When heating the heated object and applying a voltage in the same are continued, a decrease in applied voltage is observed together with a sharp increase in the density of current which flows through the heated object. The current density at this time is not particularly limited, and since it changes suddenly, the value of the current density is relatively difficult to be measured. It may be around 1 $A\ cm^{-2}$, and it may be 0.1 $A\ cm^{-2}$ or more. In the present specification, the step until the aforementioned phenomenon is observed is referred to as a voltage control step under heating (hereinafter referred to as heating/voltage control step).

In the heating/voltage control step, applying a voltage to the heated object is controlled (hereinafter referred to as voltage control) in accordance with applied voltage matching. At this step, since almost no current flows through the heated object, it is easier to manage manufacturing by controlling the applied voltage.

After a time point (hereinafter referred to as an increasing point of the current density), in which the current density increases and the applied voltage decreases, is observed, the heated object changes to a state in which the current easily flows as compared with the time point when the heating and applying voltage are started.

After the increasing point of the current density, the method of controlling bias voltage is changed from the control of the level of the applied voltage to the control of the current value matching to the heated object (hereinafter referred to as the current control) while continuing the heating on the heated object. After the step proceeds to the current control, oxygen is released from the heated object and electrons are supplied by making an electric current flow through the heated object. As a result, the mayenite type compound is converted into an electrode.

A conductive mayenite-type compound can be obtained by carrying out the current control up to the desired electron concentration. In the present specification, after the increasing point of the current density, the step in which a desired conductive mayenite-type compound is obtained and until termination of applying voltage is referred to as a current control step under heating (hereinafter referred to as heating/current control step).

The heating/current control step can be appropriately performed until the heated object reaches a desired electron concentration. Since the resistivity of the heated object decreases as conversion to an electride progresses, the process continues until the resistivity is sufficiently reduced. Although the value of the specific resistivity is not particularly limited, the heating/current control step may be performed until $1.0 \times 10^5\ \Omega \cdot cm$ or less.

On the other hand, the electrical conductivity of the heated object increases as conversion to an electride progresses, so that the electrical conductivity can be used as a measure to judge a progress degree of converting the heated object to an electride. The process may continue until the electric conductivity becomes $1.0 \times 10^{-4}$ S/cm or more.

It can also be judged by observing the color of the heated object. Specifically, a current may be made to flow until the heated object becomes a desired color according to a grade to be described later. For example, if a conductive mayenite-type compound of Grade C to be described later is desired, the heating/current control step may be continued until the heated object becomes black.

The method of changing from the heating/voltage control step to the heating current control step is not particularly limited in view of obtaining the effect of the present invention, and it can be performed by appropriately combining known methods. Specifically, examples of the methods include a method of appropriately switching by using a power supply device corresponding to a large electric power such as 100 V/10 A; and a method of preparing two voltage-applying devices for using in each of the two steps, respectively, and switching them at the point where the increasing point of current density passes.

In the manufacturing method of the present invention, the pressure condition can be used without any particular limitation. The method may be carried out under any one of the states of atmospheric pressure, reduced pressure condition and pressurized condition.

In the manufacturing method of the present invention, the ambient atmosphere around the heated object can be used without any particular limitation. As the oxygen partial pressure decreases, divergence of free oxide ions from the mayenite-type compound is promoted. Therefore, it is preferable to maintain the heated object in a low oxygen partial pressure atmosphere of 100 Pa or less, especially in an atmosphere having an extremely low oxygen partial pressure. Examples of the atmosphere having an extremely low oxygen partial pressure, specifically, include an atmosphere under an inert gas atmosphere, in which the partial pressure of oxygen is reduced to about $10^{-15}$ Pa ($10^{-20}$ atom) or less, and a state in which the degree of vacuum is $10^{-5}$ Pa or less. The inert gas is not particularly limited, and nitrogen, argon, or the like may be used. Argon is preferable.

In particular, as described above, when the heating temperature exceeds 400° C., if the oxygen partial pressure is high, the electride of mayenite-type compounds becomes susceptible to be oxidized. Therefore, the atmosphere having an extremely low oxygen partial pressure is preferable. When the heating temperature is 400° C. or lower, the atmosphere is not particularly limited.

Further, according to the manufacturing method of the present invention, the free oxide ion in the mayenite-type compound diverges as a progress of conversion to an electride. As described above, since an oxygen partial pressure affects the step of converting the mayenite-type compound into an electride and the resulting mayenite-type electride, it is preferable to exclude the diverged oxygen.

The conductive mayenite-type compound can be classified into the following three grades from Grade A to Grade C on the basis of the electron concentration per unit volume.

TABLE 1

| Grade | Electron concentration (/cm$^3$) | Electric conductivity (S/cm) | Color (visual) |
|---|---|---|---|
| A | Less than $1.0 \times 10^{17}$ | Less than $1.0 \times 10^{-4}$ | Pad yellow to yellow |
| B | $1.0 \times 10^{17}$ or more, less than $1.0 \times 10^{20}$ | $1.0 \times 10^{-4}$ or more, less than $1.0 \times 10^{0}$ | Green |
| C | $1.0 \times 10^{20}$ or more | $1.0 \times 10^{0}$ or more | Black |

The conductive mayenite-type compound obtained by the manufacturing method of the present invention can be produced in any of the above three grades. Preferably, it is suitable for manufacturing the Grade C class in which the electron concentration is highest and the electron emission ability per unit deposition is high.

Specifically, since the theoretical maximum value of the electron concentration is $2.3 \times 10^{21}$ cm$^{-3}$, it is possible to obtain a conductive mayenite-type compound having an electron concentration of $1.0 \times 10^{20}$ cm$^{-3}$ or more and $2.3 \times 10^{21}$ cm$^{-3}$ or less.

The conductive mayenite-type compound obtained may have a uniform or non-uniform electron concentration, but the uniform one is preferable. The grade of the non-uniform conductive mayenite-type compound is determined visually and the electron concentration is determined by using value of the highest electron concentration.

Further, the electrical conductivity at room temperature of the conductive mayenite-type compound obtained by the manufacturing method of the present invention is preferably 1.0 S/cm or more, more preferably 100 S/cm or more, and preferably 1500 S/cm or less, because the theoretical maximum value thereof is about 1500 S/cm.

Each step in the manufacturing method of the present invention will be described in more detail with reference to the drawings. FIG. 1 is a schematic view showing the concept of the heating/voltage control step (A) and heating/current control step (B). As shown in FIG. 1 (A), in the heating/voltage control step, free oxide ions (O$^{2-}$) in the cage of the mayenite-type compound are activated by heating the mayenite-type compound to increase an ionic conductivity and become an object having an oxide ion conductivity.

Next, as shown in FIG. 1 (B), after the resistance of the heated object decreases, the voltage control proceeds to the current control under heating and the charged electrons are made to flow through the circuit to which the voltage is applied. In this specification, in order to decrease or relax the energy barrier ($\Delta$E), a current is made forcibly flow in the potential load direction. This treatment is called a current drive (CD control). By the CD control, the cage space is kept in the electrically neutral state and the potential barrier decreases. This state facilitates the movement of oxide ions.

Electrons are stripped off in each of the above steps to reach an electron polarization state from the atomic polarization state. The electrons after the electron polarization remain in the cage, and the oxygen atoms try to diverge from the mayenite-type compound. And an oxygen divergence pressure rises with heating. "Oxygen divergence" refers to a phenomenon that free oxide ions are separated from the cage through a plurality of steps. The "oxygen divergence pressure" in the present specification means an oxygen partial pressure in the inert gas atmosphere.

Figure 3:
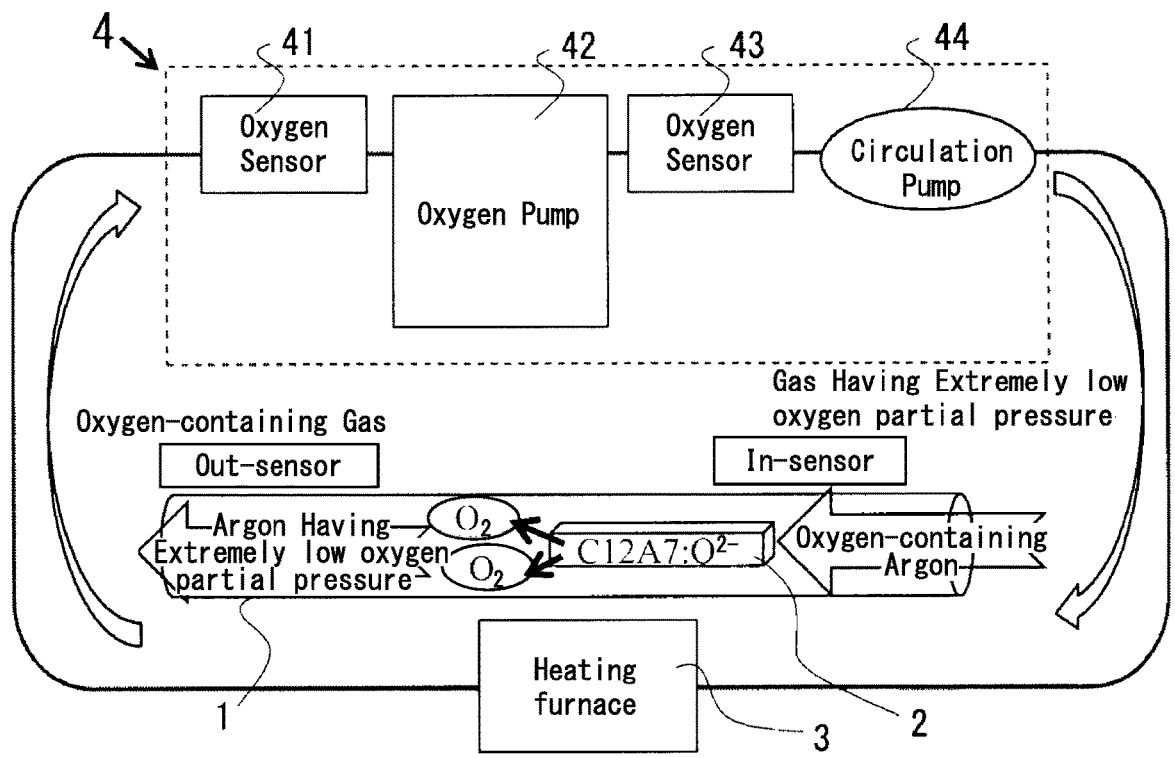
FIG. 3 is a conceptual diagram of a method for manufacturing electride using a heating furnace.

FIG. 3 conceptually shows one mode of manufacturing an electride using a heating furnace. Although this embodiment uses a heating furnace, the heating may be external heating such as a heater or internal resistance heating. C12A7:O$^{2-}$, as a heated object 2, is placed inside a quartz tube 1 through which Ar having an extremely low oxygen partial pressure flows. An extremely low oxygen partial pressure control device 4 is attached to the heating furnace 3. The extremely low oxygen partial pressure control device 4 includes an oxygen sensor 41 at inlet side of oxygen-containing gas, an oxygen pump 42, an oxygen sensor 43 at a gas outlet side, a circulation pump 44 and the like. An extremely low oxygen partial pressure gas is supplied to the heating furnace 3. And a heating atmosphere is an argon gas having extremely low oxygen partial pressure which flow into the quartz tube 1. From the heated object 2 placed in this atmosphere, $O_2$ is desorbed by the voltage control under heating and by the current control under heating. Ar containing the desorbed oxygen flows out from the first outer quartz tube, and circulated to the extremely low oxygen partial pressure control device 4.

In the heating/voltage control step, when a voltage is applied in a range of 200 V or less, as the heating temperature rises, the ion conductivity increases (resistance decreases), so that the sample can be converted into an electride at a low voltage when at high temperature. In order to converting the sample to an electride at a temperature as low as possible, in case of a low ion conductivity and at low temperature, it is necessary to apply a comparatively high voltage to increase the current in the mayenite-type compound in proportion to the high applied voltage. However, when heating temperature increases to about 300° C. or higher, the resistance decreases as the temperature rises so that the applied voltage decreases and the oxide ion conductivity rises. As a result, the current in the mayenite-type compound rises. Therefore, the voltage may be controlled within a range of 0 V to 200 V in relation to the heating temperature. However, in this case, as shown in FIG. 1 (A), in order to make oxide ions move between cages, it is necessary to go beyond the energy barrier for widening a spatially-narrow bottleneck between the cages.

The reaction mechanism of the manufacturing method of the present invention is presumed as follows.

Oxygen atoms constituting a cage of a mayenite-type compound are firmly bonded to calcium atoms and aluminum atoms and are not eliminated unless the crystal lattice is destroyed. On the other hand, free oxide ions in the cage are bound loosely.

When a voltage is applied to the mayenite-type compound, the cage cannot move. However, the oxide ions move in the direction of a current flow. Specifically the oxide ions are drawn by a positive electrode (+) and move by replacing the oxide ions in the cage wall. Therefore, in order to move the oxide ions, it is necessary to apply a voltage exceeding a potential barrier ($\Delta E$) necessary to substitute the oxide ions of the cage wall of the mayenite-type compound composed of Ca—Al—O. Therefore, the heating temperature and/or the voltage are raised step by step until the resistance of the heated object drops suddenly and a current density rapidly increases. The ionic conductivity at that time is obtained by measuring the electric resistance.

The mayenite-type compound in the vicinity of the positive electrode is electrolyzed into a conductive mayenite-type compound and oxygen. As a result, oxygen is released outside the cage. As the ionic conductivity of free oxide ions increases by heating, free oxide ions moving near the positive electrode is substituted with successive electrons. And as a result, conversion to an electride proceeds.

Consequently, the free oxide ions, which had been diverged by using a reducing agent conventionally, are able to be diverged without using a reducing agent and the mayenite-type compound is converted into an electride.

EXAMPLE

Hereinafter, the manufacturing method of the present invention will be described in detail based on examples.

Example 1

[Voltage Control Under Heating and Current Control Under Heating]

Figure 6:
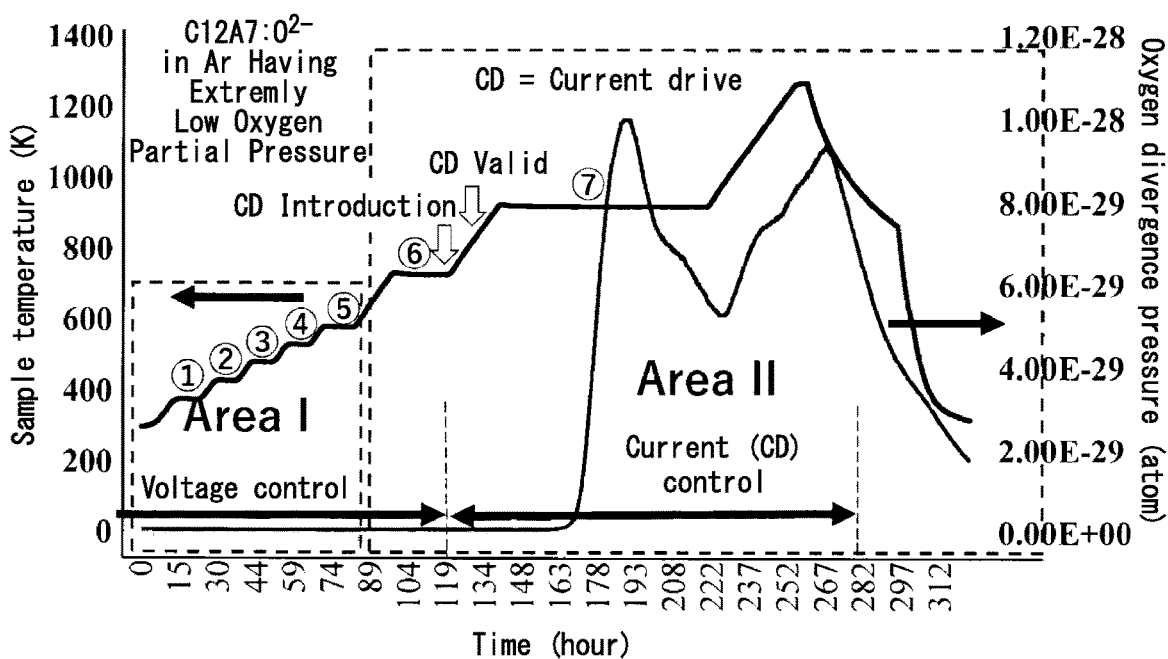
FIG. 6 is a graph showing the temporal change (horizontal axis) in sample temperature (left vertical axis), applied voltage/current, and oxygen divergence pressure (right vertical axis) in Area I (voltage control region) and Area II (current control region), respectively.

A C12A7 single crystal obtained by the FZ method was cut into a size of 10 mm×5 mm×1 mm and a platinum (Pt) thin film was deposited by sputtering method at both ends (end face area: 5 mm×1 mm) as shown in FIG. 1. Both electrodes of the positive electrode and the negative electrode were attached with a molybdenum (Mo) wire to the heated object, and a voltage was applied in a heating state in accordance with the history as shown in FIG. 6. Specifically, a high temperature treatment up to 1000° C. and up to 1200° C. was carried out under a voltage control and under a current control. The processing atmosphere was Ar having an extremely low oxygen partial pressure (Ar flow rate: 3 L/min, average flow velocity: 5.2 cm/sec, atmospheric pressure, normal temperature). The equipment of Canon Machinery Co., Ltd. was used as an extremely low oxygen partial pressure control device. An oxygen partial pressure was measured with an Out-sensor and an In-sensor, as shown in FIG. 3. An extremely low oxygen partial pressure control below is the same as the above-mentioned one.

As a result, as shown at the right vertical axis in FIG. 6, a large amount of oxygen divergence occurred in a constant temperature state of about 650° C., and an increase in re-divergence pressure of oxygen was observed when reheated to 1000° C. In the region of 0 min to 119 min indicated by "Area I" in the FIG. 6, stepwise temperature increased [(1)-(6)] by the voltage control on the heated object. In Area II after 119 minutes, a step was changed from the voltage control to the current control (CD introduction). And in the latter half of the experiment, the CD control for increasing the current control value was performed.

Figure 7:
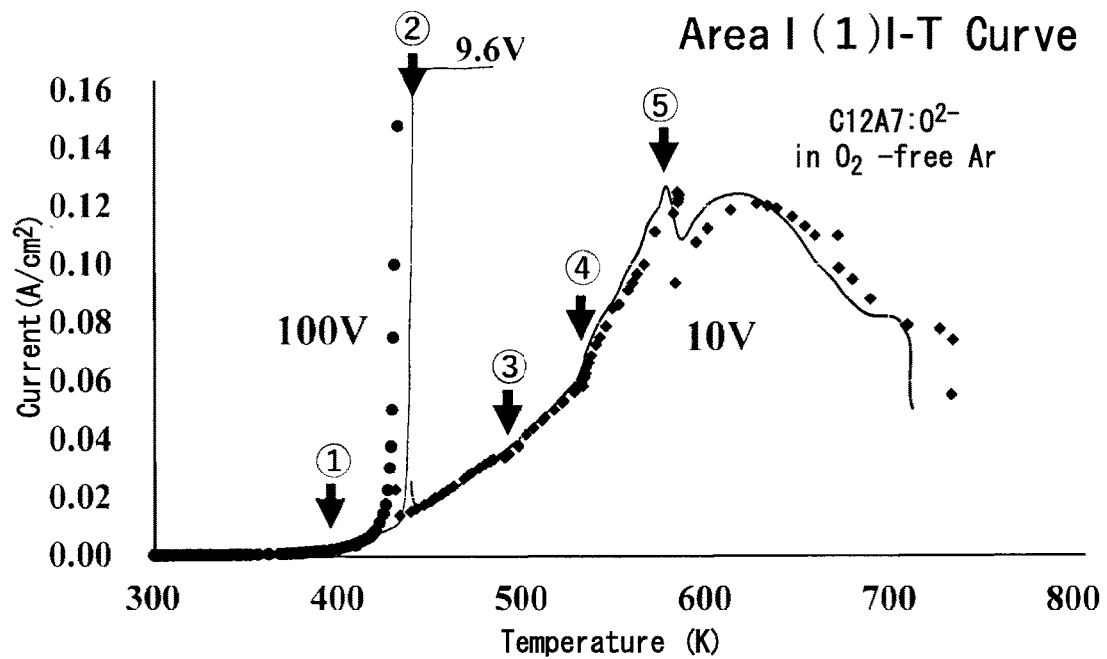
FIG. 7 is a graph showing a relationship (I-T curve) between currents (vertical axis) in a heated object under voltage control (100 V and 10 V) in Area I and heating temperatures (horizontal axis).

As shown in FIG. 7, in the voltage control of Area I, it was confirmed that the current density in the sample rapidly increased from 0.1 A·cm$^{-2}$ due to the heating temperature change (heating rate 10 K/min).

Figure 8:
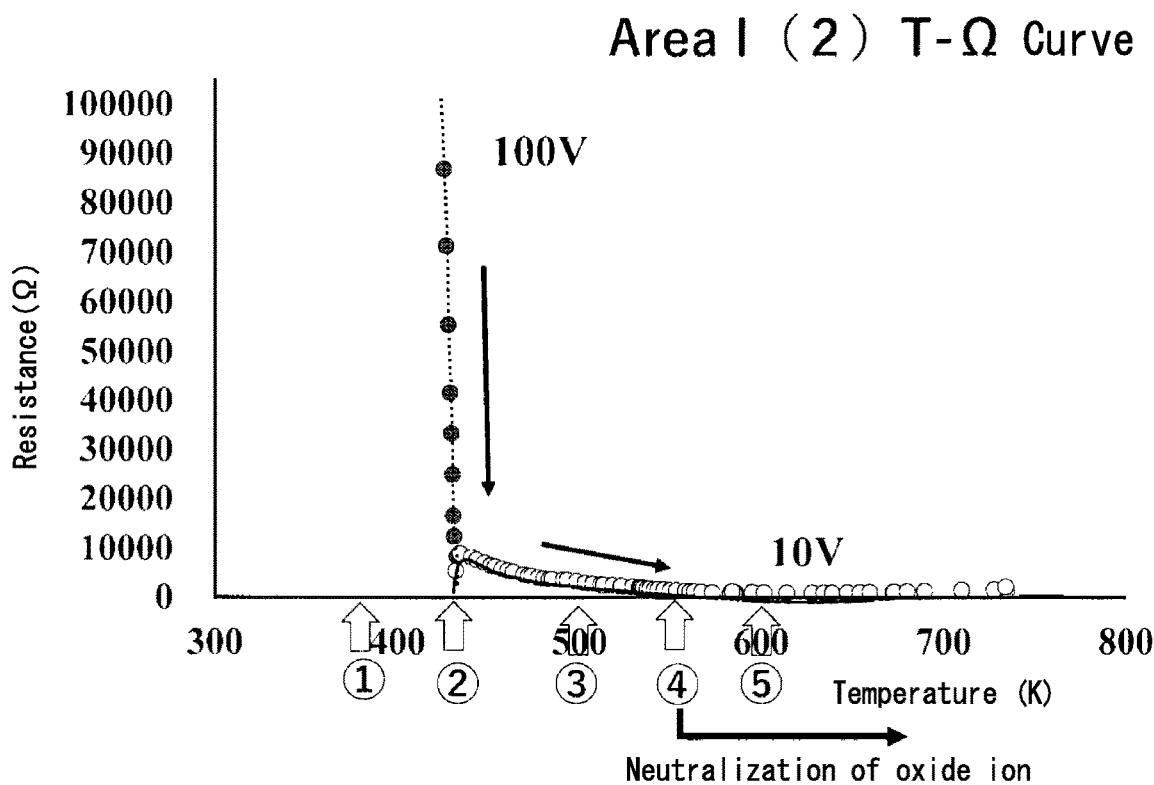
FIG. 8 is a graph showing a relationship (T-Ohm curve) between an electric resistance (vertical axis) and a heating temperature (horizontal axis) of a heated object under voltage control (100 V and 10 V)

The resistance of the heated object at this time was investigated. As shown in FIG. 8, the resistance of the heated object abruptly decreased as the heating temperature increased. The state before the heating temperature indicated by arrows (1) and (2) in FIG. 8 shows the insulator behavior of the heated object. When 100 V voltage was applied, the resistance gradually decreased due to heating and shows the behavior of ionic conductor formation. When the heating was further continued while changing the applied voltage from 100 V to 10 V in the heating step indicated by the arrow (2), the resistance almost disappeared in the heating step indicated by the arrow (4), and the conversion to an electride progressed.

[Influence of Applied Voltage]

Figure 9:
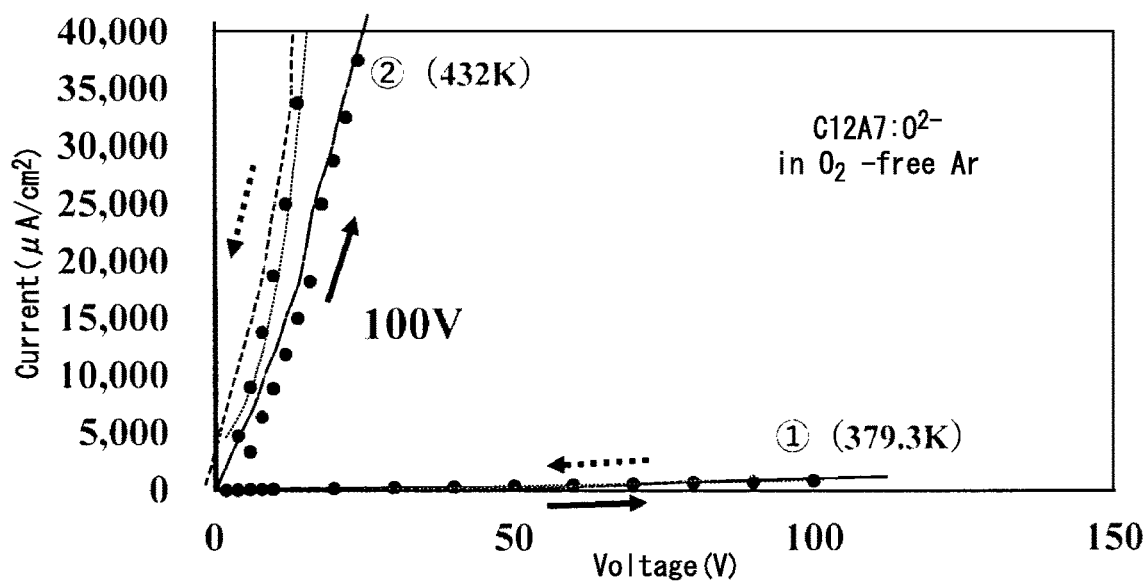
FIG. 9 is a graph showing a relationship (I-V curve) between a current (vertical axis) change in a heated object under voltage control (100 V) in Area I and an applied voltage (horizontal axis).
Figure 10:
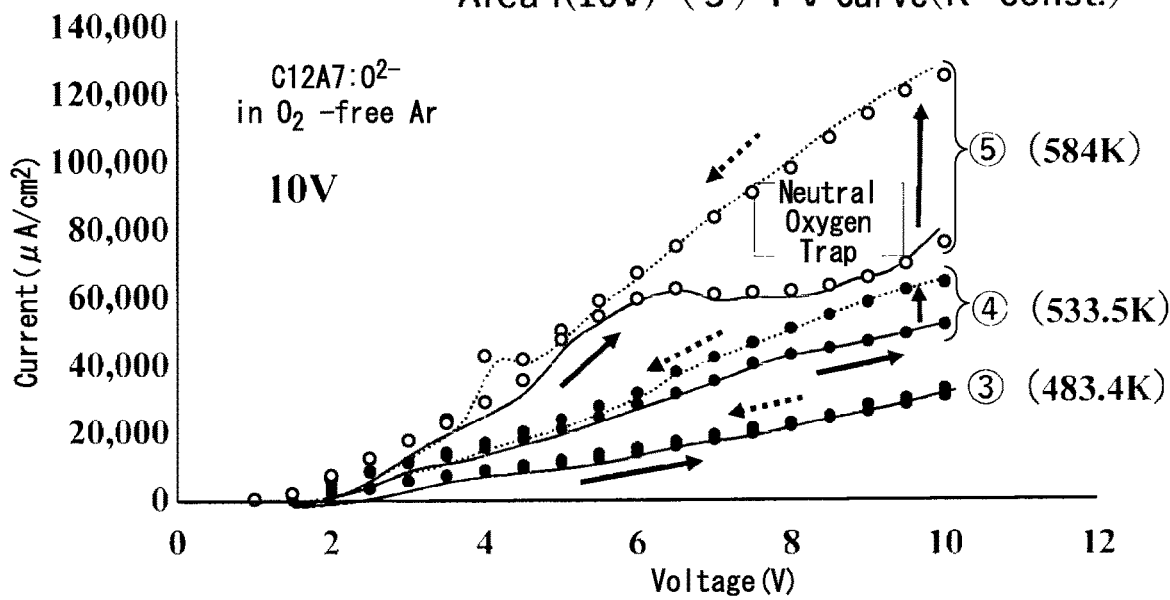
FIG. 10 is a graph showing a relationship (I-V curve) between a current (vertical axis) change in a heated object under voltage control (10 V) in Area I and an applied voltage.

The relationship (I-V curve) between the applied voltage and the current in the sample under a constant heating temperature by increasing/decreasing the applied voltage was investigated. As a result, as shown in FIGS. 9 and 10, hysteresis occurred during a change of increasing voltage and a change of decreasing voltage in heating state at higher temperature. That is, the irreversible change means that free oxide ions are spatially unevenly distributed in the heated object.

In the low temperature (379.3 K) state of (1) in FIG. 9, since the mayenite-type compound is in an electric insulated state, almost no current flows during voltage rising and falling. When an ion conductivity develops to some extent during heating at the temperature (432 K) of (2), it behaves irreversibly during voltage rising and falling, that is, when free oxide ions moved to the positive electrode during voltage rising and falling, a part of the free oxide ions did not return to its original position and the free oxide ions were unevenly distributed. On the other hand, a trap is a phenomenon which occurs when a voltage is applied in one direction.

[Influence of Heating Temperature]

Figure 11:
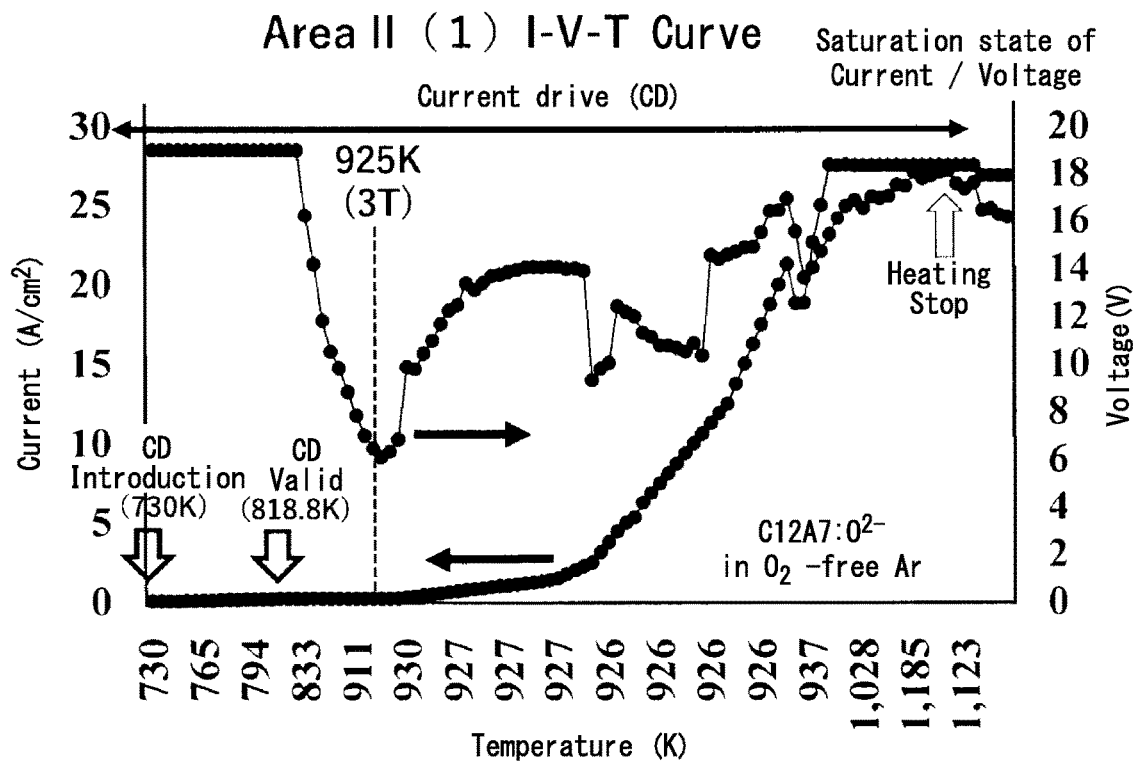
FIG. 11 is a graph showing a correlation (I-V-T curve) among currents (left vertical axis) in the sample, applied voltages (right vertical axis) and heating temperatures under the current control and the CD control of Area II.

FIG. 11 shows the current control of Area II and the temperature dependence of the current and voltage in the heated object under CD control. A sharp change in the sample voltage is observed at a stage that the heating temperature reaches about 819 K from about 18 V at the start of the current control (730 K). At the stage that the sample voltage decreases to about 7 V at 925 K, the current in the heated object rises gradually.

Figure 12:
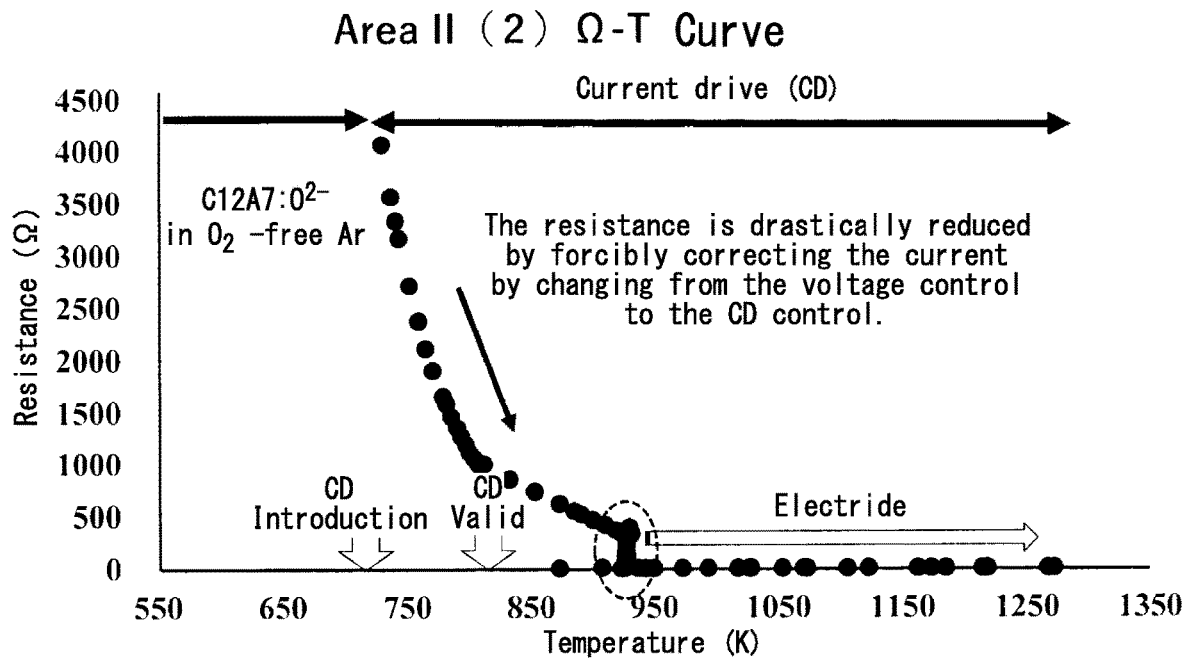
FIG. 12 is a graph showing a correlation (T-Ohm curve) among current control of Area II, resistances (vertical axis) and heating temperatures (horizontal axis) of the sample under CD control.
Figure 13:
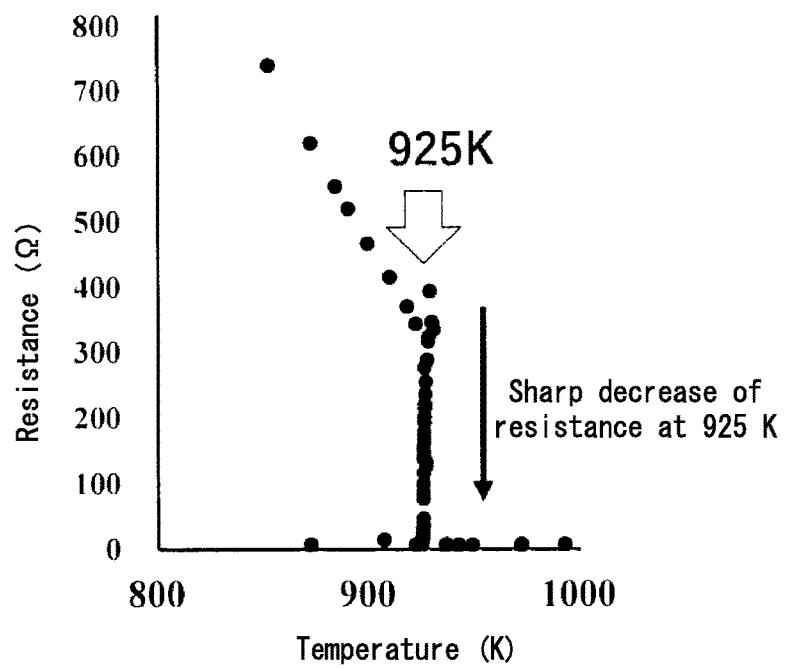
FIG. 13 is an enlarged view of the resistance transition temperature (925 K) portion in FIG. 12.
Figure 14:
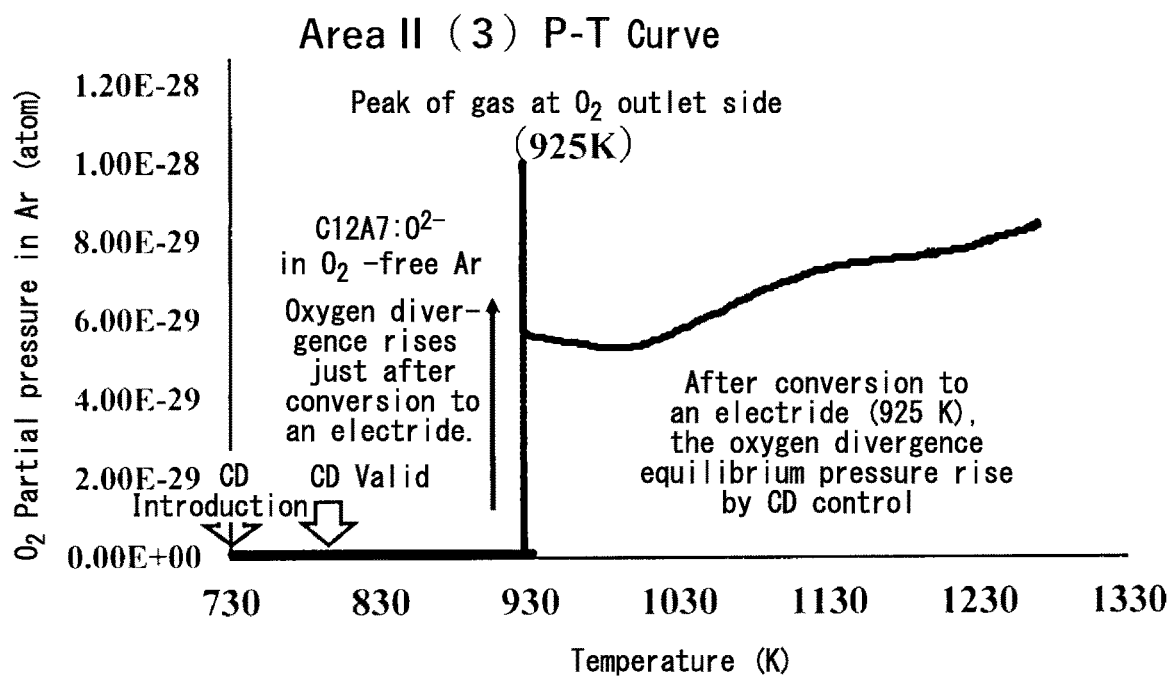
FIG. 14 is a graph showing the relationship (P-T curve) between oxygen divergence pressures (vertical axis) and heating temperatures (horizontal axis) (P-T curve) under the current control and CD control of Area II.
Figure 15:
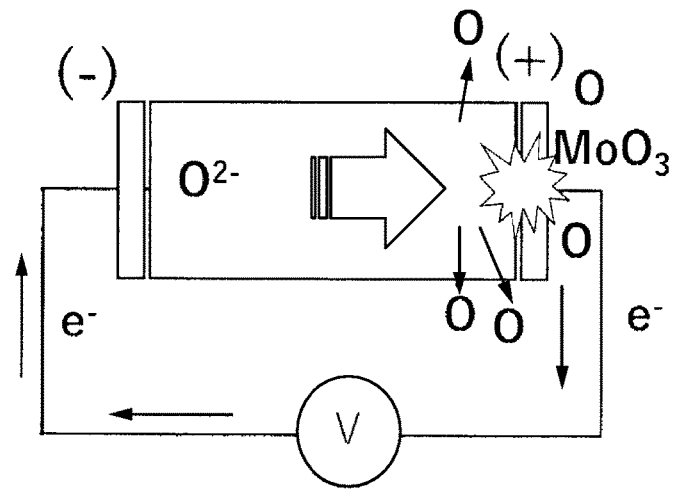
FIG. 15 is a schematic view (B) showing a state in which monoatomic oxygen desorbed on the positive electrode side oxidizes molybdenum (Mo) of the positive electrode.

As shown in FIG. 12 and FIG. 13 (partial enlarged view of FIG. 12), the resistance of the heated object at that time was further abruptly decreased at 925 K. Therefore, hereinafter, the transition temperature of this resistance, 925 K, is referred to as 3T (=Triggering Transition Temperature). Similarly, FIG. 14 shows the relationship between oxygen divergence pressure ($O_2$ partial pressure in Ar) and heating temperature. A rapid rise in oxygen divergence pressure was observed at 3T and an increase in oxygen divergence pressure was observed after 3 T, as the heating temperature increases. FIG. 15 is a schematic view showing a state where the oxygen, which diverged into the Ar atmosphere on the positive electrode side, oxidizes molybdenum (Mo) of the molybdenum wire attached to the positive electrode.

Figure 16:
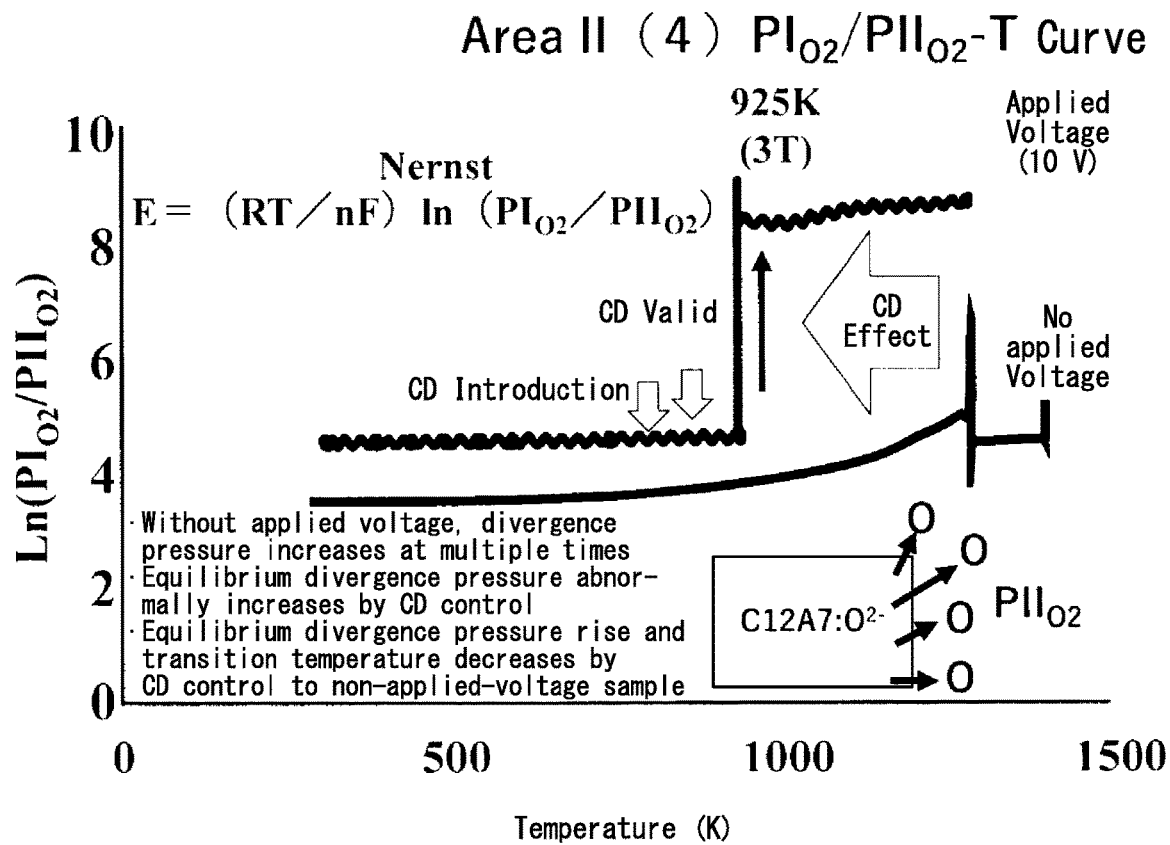
FIG. 16 is a graph showing the relationship (P-T curve) between oxygen divergence pressure ratios (vertical axis) and heating temperatures (horizontal axis) under the current control and the CD control of Area II, in comparison with the case of no voltage is applied.

In FIG. 16, relationships between the equilibrium divergence pressure ratio ($PI_{O2}/PII_{O2}$) and the heating temperature (T) in the case of CD control (10 V voltage was applied) and in the case of the heated object with no electrode attached (no voltage was applied) were compared. The results are shown in FIG. 16, and from the results, the 3T temperature decreased (CD validity) when introducing CD. $PI_{O2}$ and $PII_{O2}$ are the $O_2$ partial pressure ($PI_{O2}$) measured by the In-sensor and the $O_2$ partial pressure ($PII_{O2}$) measured by the Out-sensor, respectively.

[Evaluation of Power Consumption]

Figure 17:
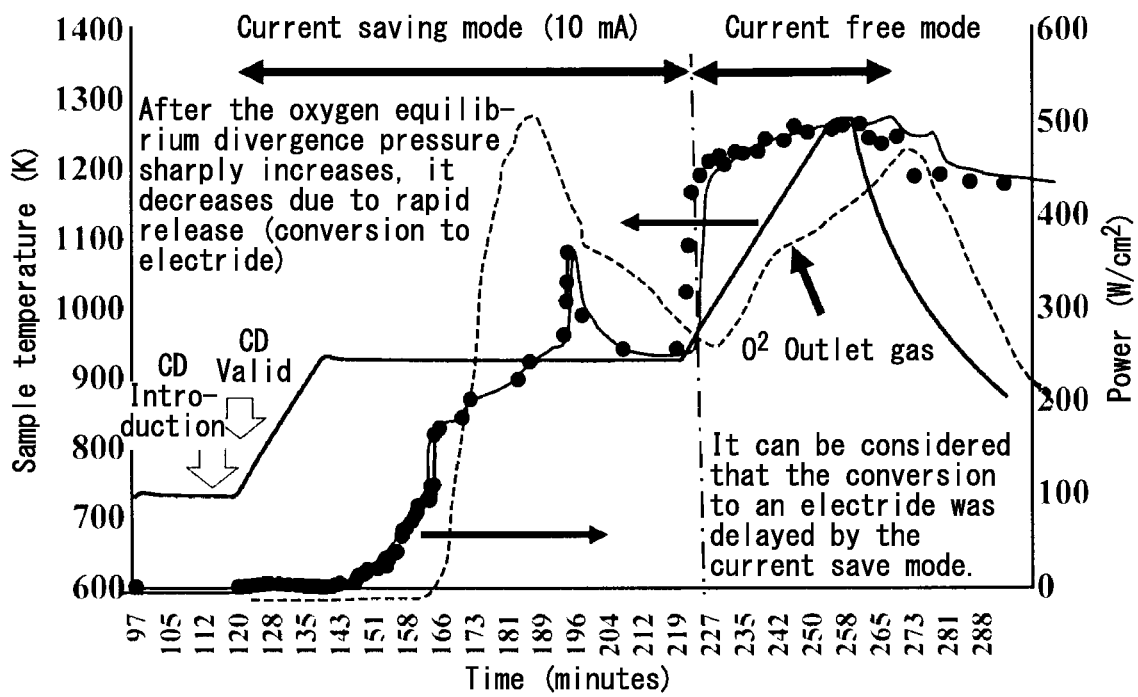
FIG. 17 is a graph showing temporal change (horizontal axis) of the heating temperature (left vertical axis), power consumption (right vertical axis) and oxygen divergence pressure (T-W-Time curve) under the current control and the CD control of Area II.

FIG. 17 shows temporal changes of temperature, power consumption, and oxygen divergence pressure after CD control. A power consumption peak appears in the latter half of the 3T temperature maintenance state in the current control state, and after the peak of the oxygen divergence pressure. After the power consumption peak, although the power consumption temporarily decreased, when the current in the heated object was increased by the CD control, the power consumption turned to increase and be saturated at a maximum of about 500 W/cm$^2$.

Example 2

The C12A7 single crystal obtained by the FZ method was cut into a size of 10 mm×5 mm×1 mm. A platinum thin film was deposited on both ends by sputtering method, and each end was used as a positive electrode and a negative electrode, respectively. Molybdenum lead wires were attached to the positive electrode and the negative electrode to obtain a heated object.

First, when a voltage of 100 V was applied to the heated object at atmospheric pressure, a current of about 1 pA (current density 20 pA·cm$^{-2}$) was observed at a sample temperature of about 30° C.

Next, the power supply was switched to a power source in which a maximum voltage of 100 V was applied and maximum current of 30 A was allowed to flow. After raising a temperature from the room temperature in steps of 10° C., the temperature of the heated object was maintained and a voltage was applied up to 100 V at each temperature. This treatment was repeated until 180° C. was reached. The minimum detectable current of this power supply was 0.1 mA. However, no current was observed under the above conditions.

Figure 18:
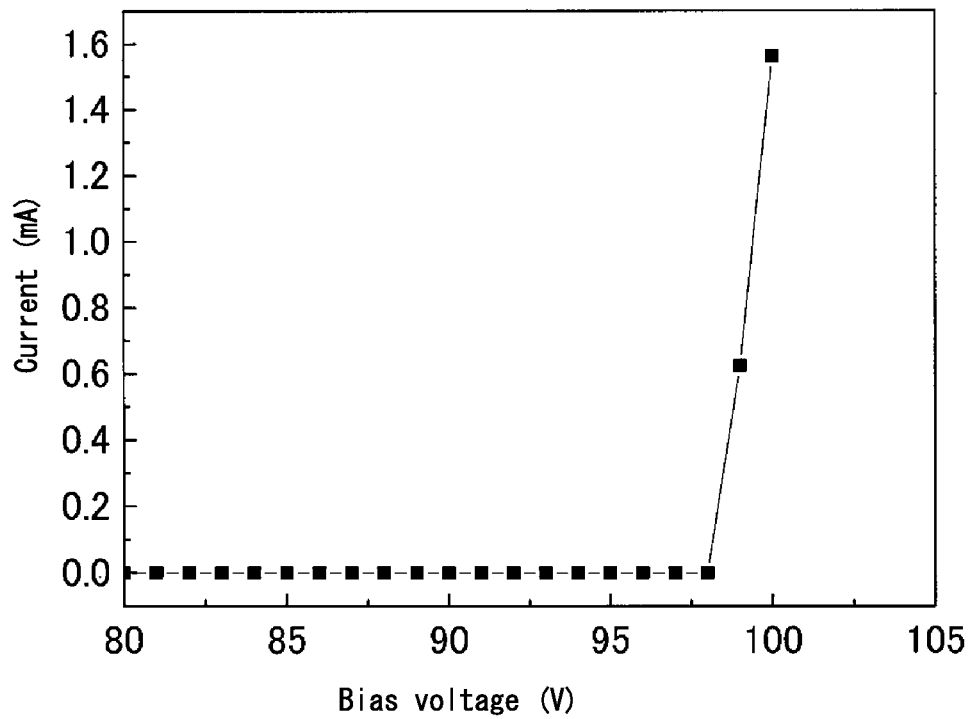
FIG. 18 is a graph showing the relationship between applied voltage and current in Example 2.

When holding the temperature of the heated object at 180° C., a current of 0.6 mA (current density 12 mA·cm$^{-2}$) was observed when a voltage of 99 V was applied (FIG. 18). At this point, the resistivity of the heated object was 1.7×10$^4$Ω·cm. This means that the heated object had been converted to an electride of Grade B or higher. When the voltage was held at 100 V, a sharp increase in a current value of about 550 mA was observed after about 25 seconds. At the same time, it became impossible to make enough current flow for applying 100 V to the sample.

Figure 19:
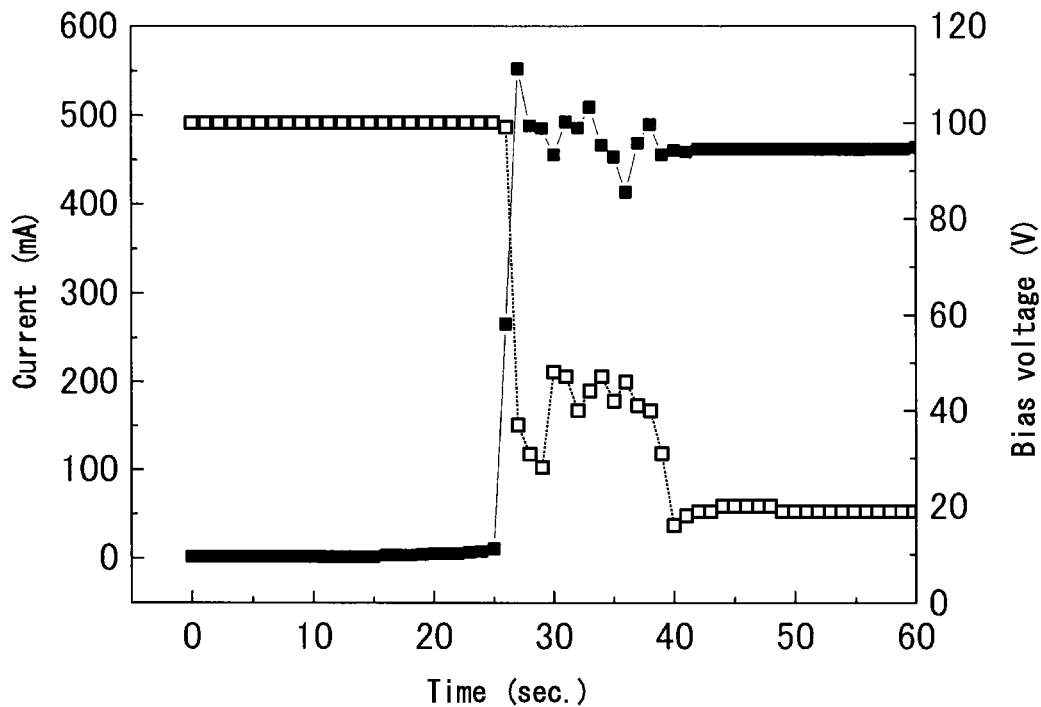
FIG. 19 is a graph showing the relationship between elapsed time and current during current control in Example 2.

Here, a method of applying voltage to the heated object was shifted from the voltage control to the current control (FIG. 19). Approximately 100 seconds after current control, the condition of the heated object was confirmed. As a result, the heated object was blackened, and the C12A7 was converted into an electride. Unevenness of electron concentration occurred in the heated object. An electron concentration at the portion having the highest electron concentration was about 1.0×10$^{21}$/cm$^3$, and that at the portion having the lowest electron concentration was about 1.0×10$^{19}$/cm$^3$. The heated object had been converted into an electride (the electride of mayenite-type compounds of this Example). The electric conductivity of the portion which has the highest electron concentration in the heated object was 5×10$^2$S/cm.

Example 3

Figure 20:
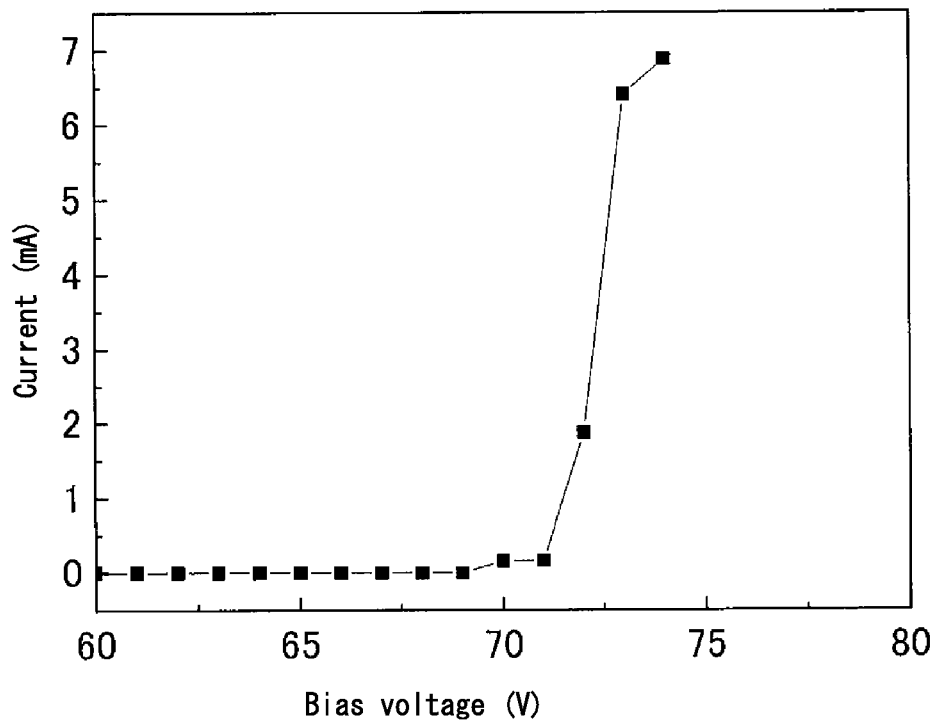
FIG. 20 is a graph showing the relationship between applied voltages and currents in Example 3.
Figure 21:
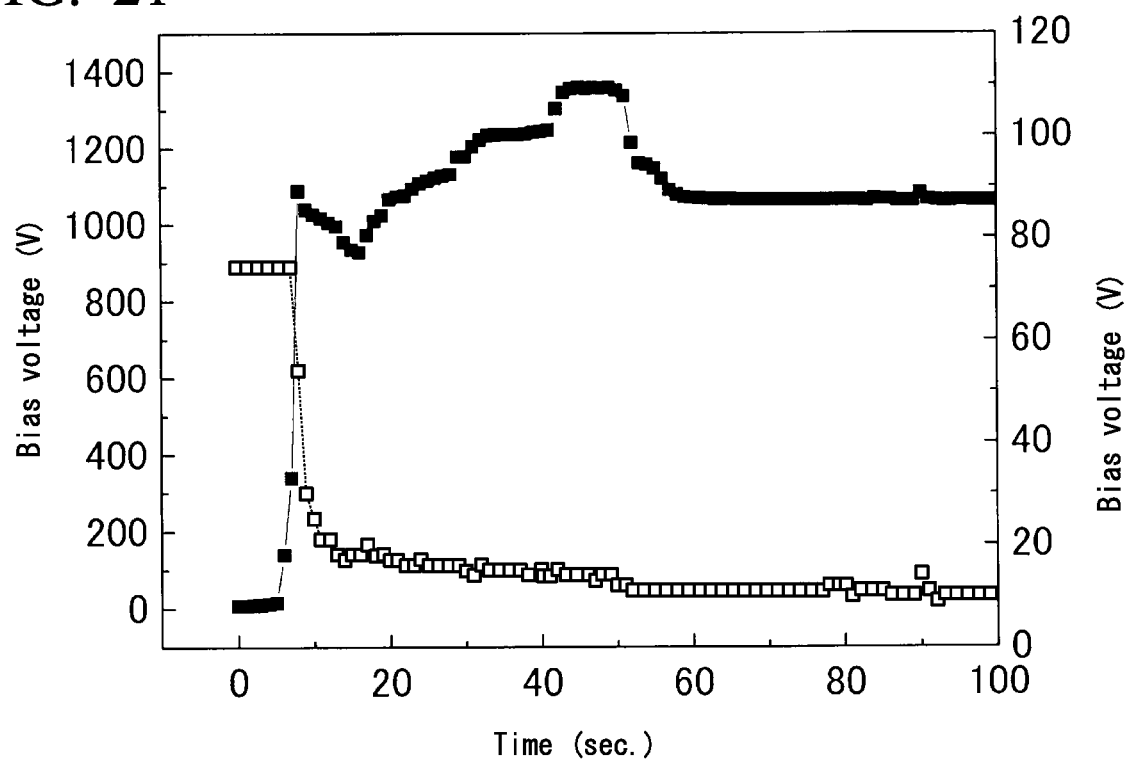
FIG. 21 is a graph showing the relationship between elapsed time and currents during current control in Example 3.

The heating temperature of C12A7 was raised from a room temperature to 210° C. by the same procedure as in Example 2 and then was maintained at 210° C. After that, the same experiment as in Example 1 was carried out. As a result, a current of 0.2 mA (current density 4 mA·cm$^{-2}$) was observed when a voltage of about 70 V was applied (FIG. 20). The resistivity of the heated object at this point is 5.0×10$^4$Ω·cm. This means that the heated object has been converted into an electride of Grade B or higher. When the voltage was held at 75 V, a sharp increase of current of about 1100 mA was observed after about 7 seconds, so the voltage control shifted to the current control (FIG. 21). Approximately 100 seconds after the current control, it was confirmed that the appearance of the sample turned black and C12A7 was converted to an electride. There was no difference in the electron concentration in the heated object, and it was an electride with uniform electron concentration of 1.0×10$^{21}$ cm$^3$. The electric conductivity of the heated object which had been converted into an electride (the electride of mayenite-type compounds of this example) was 5×10$^2$S/cm.

Example 4

In the same manner as in Example 1, the heated object was prepared. When a voltage was applied to the sample, the sample was placed in an electric heating furnace capable of heating up to 1000° C., and the inside of the heating furnace was heated to 1000° C. Then, Ar having a very low oxygen partial pressure (flow rate: 3 L/min, average flow velocity: 5.2 cm/sec, atmospheric pressure, room temperature) was flowed into the heating furnace up to 10$^{-29}$ Pa (10$^{-34}$ atom). Oxygen escaping from the cage was mixed into the Ar atmosphere having extremely low oxygen partial pressure. The oxygen in the Ar atmosphere was extracted from the Ar atmosphere by the extremely low oxygen partial pressure control device on the principle of the oxygen pump. Ar having extremely low oxygen partial pressure was again flowed into the heating furnace.

In the low temperature state, since the heated object exhibited an insulator behavior, a maximum of the voltage of 100 V was applied. However, as the temperature was raised stepwise, ionic conduction occurred. As a result, the electric current flowing through the sample rapidly increased from 0.1 A·cm$^{-2}$, and the voltage gradually decreases to 10 V.

Under the voltage control, the current amount did not increase even if the temperature increased thereafter. For this reason, the amount of current flowing through the sample increased with increasing heating temperature by shifting from voltage control to current control at a stage where the temperature increased to some extent. Eventually the resistance sharply decreased and it decreased to the same level as the metal conductor.

When an oxygen concentration in argon at that time was measured, a remarkable oxygen divergence from the sample was observed after the electric resistance suddenly decreased. At the same time, a remarkable light emission phenomenon was observed on the positive electrode side of the sample. This means that an oxidation reaction between the diverged oxygen from the sample and the molybdenum wire connected to the positive electrode occurred. When the sample naturally cooled in the electric heating furnace was taken out, it was observed that the heated object which was transparent before the treatment turned black and was converted to Grade C. That is, the electrode having an electron concentration of $10^{20}/cm^3$ or more was obtained. The electric conductivity of the heated object which had been converted into an electrode (electrode of mayenite-type compounds of this Example) was $5 \times 10^2$ S/cm.

Comparative Example 1

A C12A7 single crystal obtained by the FZ method was cut into a size of 10 mm×5 mm×1 mm to obtain a heated object. Using the apparatus as shown in FIG. 3, the heated object was heated in a heating furnace. The heating atmosphere was Ar having extremely low oxygen partial pressure (Ar flow rate: 3 L/min, average flow velocity: 5.2 cm/sec, atmospheric pressure, normal temperature).

Figure 4:
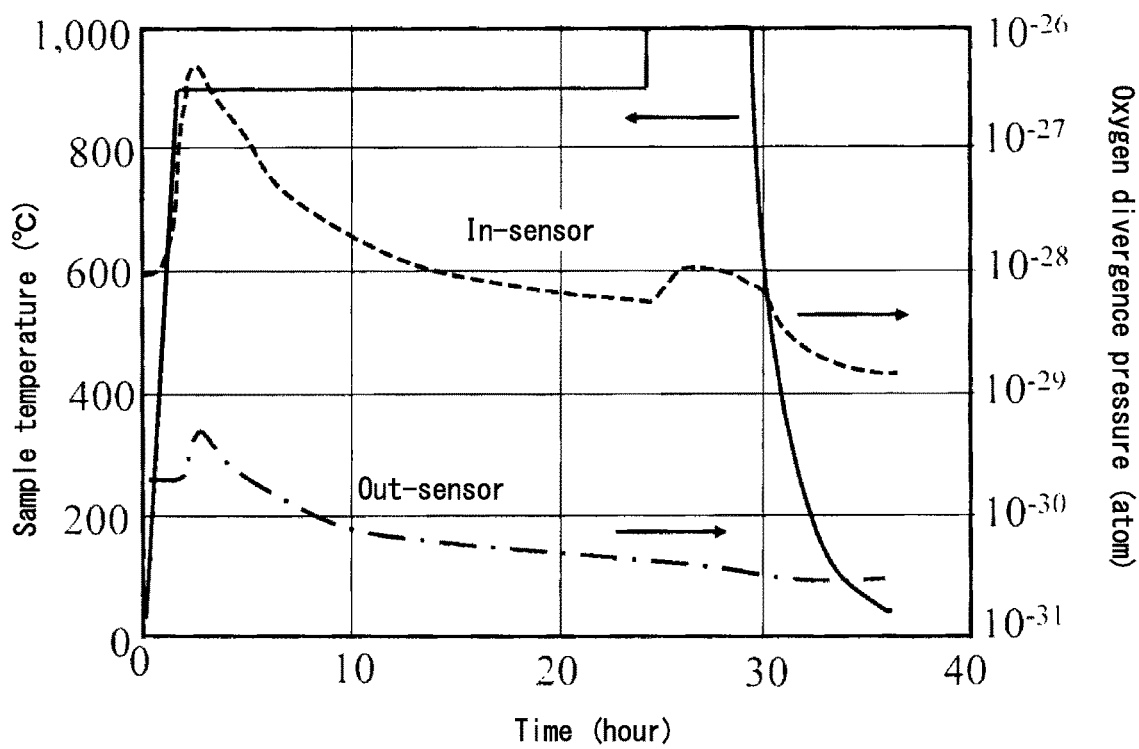
FIG. 4 is a graph showing temporal change (horizontal axis) in the sample temperature (left vertical axis) and the oxygen divergence pressure (right vertical axis) according to the measurement of the In-sensor and Out-sensor in Comparative Example 1, in the experiment method shown in FIG. 3.

As shown in FIG. 4, the heated object was heated from room temperature to 900° C. for 1 hour and then kept at 900° C. for about 25 hours. Thereafter, the heated object was heated to 1000° C., and was further held for 5 hours. Then, it was allowed to cool naturally to room temperature. Since the heated object after the heat treatment was pale yellow, the electron concentration of the mayenite-type compound after the heat treatment was likely less than $1.0 \times 10^{17}/cm^3$. The grade was judged to be Grade A.

Accordingly, it was found that it was impossible to sufficiently convert the mayenite-type compound into an electride by only heat treatment.

Comparative Example 2

Figure 5:
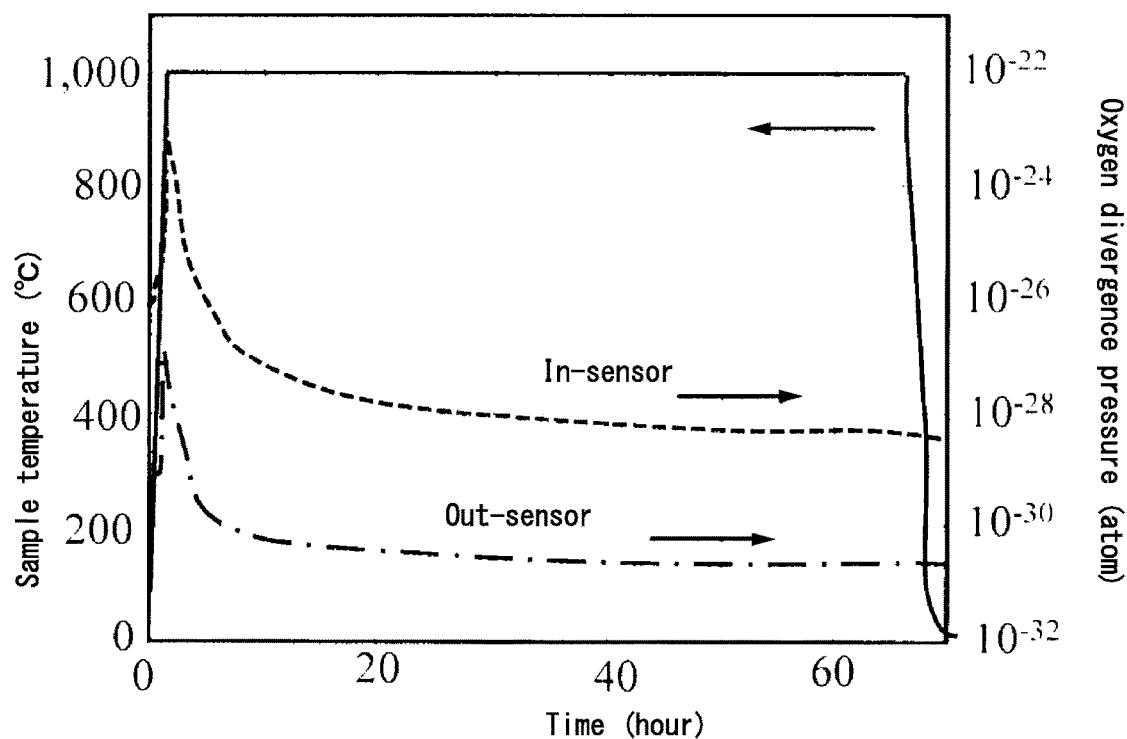
FIG. 5 is a graph showing the temporal change (horizontal axis) in the sample temperature (left vertical axis) and the oxygen divergence pressure (right vertical axis) according to the measurement of the In-sensor and Out-sensor in Comparative Example 2, in the experiment method shown in FIG. 3.

The same treatment as in Comparative Example 1 was carried out except that a C12A7: O2$^-$ powder sample which was a poly-crystal was used in place of the C12A7 single crystal of Comparative Example 1. This process was carried out in a history as shown in FIG. 5. As the same as in Comparative Example 1, the grade of mayenite-type compound after heat treatment was Grade A. As the same as the C12A7 single crystal, it was impossible to sufficiently convert the mayenite-type compound into an electride by only heat treatment.

INDUSTRIAL APPLICABILITY

According to the manufacturing method of the present invention, the process can be shortened as compared with the conventional process. In addition, it is possible to produce electride having a high electron concentration, especially at low temperature and in short time with low energy.

The invention claimed is:

1. A method for manufacturing an electride of mayenite-type compounds, the method comprising:
converting a mayenite-type compound to an electride by making a current directly flow through the mayenite-type compound by applying a voltage to the mayenite-type compound in a heating state.

2. The method for manufacturing an electride of mayenite-type compounds according to claim 1, wherein
the voltage is applied until an electrical resistivity of the mayenite-type compound becomes $1.0 \times 10^5 \Omega \cdot cm$ or less.

3. The method for manufacturing an electride of mayenite-type compounds according to claim 1, wherein
a positive electrode and a negative electrode are provided to the mayenite-type compound to making a current directly flow.

4. The method for manufacturing an electride of mayenite-type compounds according to claim 1, wherein
the mayenite-type compound is converted to an electride under an inert gas atmosphere.

5. The method for manufacturing an electride of mayenite-type compounds according to claim 1, wherein
an electron concentration of the electride of mayenite-type compounds is $1.0 \times 10^{20}/cm^3$ or more.

\* \* \* \* \*

UNITED STATES PATENT AND TRADEMARK OFFICE
CERTIFICATE OF CORRECTION

| | |
|---|---|
| PATENT NO. | : 11,267,720 B2 |
| APPLICATION NO. | : 16/319776 |
| DATED | : March 8, 2022 |
| INVENTOR(S) | : Hideo Hosono et al. |

It is certified that error appears in the above-identified patent and that said Letters Patent is hereby corrected as shown below:

On the Title Page

Item (71) Applicants name "TOKYO INSTITUTE OF TECHNOLOGY, Tokyo (JP); HIROSAKI UNIVERSITY, Aomori (JP)" should be --JAPAN SCIENCE AND TECHNOLOGY AGENCY, Saitama (JP)--

Signed and Sealed this
Seventeenth Day of May, 2022

Katherine Kelly Vidal
*Director of the United States Patent and Trademark Office*